(12) United States Patent
Sya et al.

(10) Patent No.: US 7,324,344 B2
(45) Date of Patent: Jan. 29, 2008

(54) TECHNIQUES FOR ATTACHING A HEATSINK TO A CIRCUIT BOARD USING ANCHORS WHICH INSTALL FROM AN UNDERSIDE OF THE CIRCUIT BOARD

(75) Inventors: George Sya, Fremont, CA (US); Hong Huynh, Fremont, CA (US); Michael Koken, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 214 days.

(21) Appl. No.: 11/001,411

(22) Filed: Dec. 1, 2004

(65) Prior Publication Data

US 2006/0114658 A1   Jun. 1, 2006

(51) Int. Cl.
*H05K 7/20* (2006.01)

(52) U.S. Cl. ............... 361/719; 257/719; 165/80.3; 165/185; 361/704

(58) Field of Classification Search ........ 257/718–719; 361/719
See application file for complete search history.

(56) References Cited

U.S. PATENT DOCUMENTS

| | | | |
|---|---|---|---|
| 4,607,685 A | 8/1986 | Mitchell, Jr. ............... 165/80.3 |
| 5,329,426 A | 7/1994 | Villani ......................... 361/719 |
| 5,380,211 A | 1/1995 | Kawaguchi et al. .......... 439/74 |
| 5,640,305 A | 6/1997 | Smithers ...................... 361/719 |
| 5,734,556 A | 3/1998 | Saneinejad et al. ......... 361/719 |
| 5,764,498 A | 6/1998 | Sundstrom ................... 361/809 |
| 5,786,989 A | 7/1998 | Kawabe ....................... 361/759 |
| 5,875,545 A | 3/1999 | DiStefano et al. ............. 29/840 |
| 5,894,882 A | 4/1999 | Kikuchi et al. ............. 165/80.3 |
| 5,896,270 A | 4/1999 | Tsui ............................ 361/704 |
| 5,949,020 A | 9/1999 | Mitchell et al. ......... 174/40 CC |
| 5,969,952 A | 10/1999 | Hayashi et al. ............. 361/774 |
| 5,984,692 A | 11/1999 | Kumagai et al. ............. 439/66 |
| 6,061,240 A * | 5/2000 | Butterbaugh et al. ....... 361/704 |
| 6,198,630 B1 | 3/2001 | Cromwell .................... 361/704 |
| 6,208,517 B1 | 3/2001 | Prince et al. ................ 361/704 |
| 6,219,244 B1 * | 4/2001 | Chen ........................... 361/704 |
| 6,222,734 B1 | 4/2001 | Bookhardt et al. ......... 361/719 |
| 6,269,863 B1 | 8/2001 | Wyler ........................ 165/80.3 |

(Continued)

OTHER PUBLICATIONS

TCM Thermal Reticle 32262, Research Disclosure, Feb. 1991, No. 322, Kenneth Mason Publications Ltd., England, 1 page.

(Continued)

*Primary Examiner*—Greg Thompson
(74) *Attorney, Agent, or Firm*—BainwoodHuang

(57) ABSTRACT

A heatsink attachment assembly includes a first anchor, a second anchor and a heatsink clip. The first anchor is configured to insert into a first hole in a circuit board in an upward direction from an underside of the circuit board toward a topside of the circuit board. Similarly, the second anchor is configured to insert into a second hole in the circuit board in the upward direction. The heatsink clip has (i) a first end configured to fasten to the first anchor when the first anchor is inserted into the first hole in the circuit board, (ii) a second end configured to fasten to the second anchor when the second anchor is inserted into the second hole in the circuit board, and (iii) a middle section configured to provide force on a heatsink in a downward direction which is substantially opposite the upward direction.

21 Claims, 4 Drawing Sheets

U.S. PATENT DOCUMENTS

| | | | |
|---|---|---|---|
| 6,293,331 B1 | 9/2001 | Wang | 165/80.3 |
| 6,315,038 B1 | 11/2001 | Chiu | 165/185 |
| 6,353,537 B2 | 3/2002 | Egawa | 361/704 |
| 6,401,807 B1 | 6/2002 | Wyler et al. | 165/121 |
| 6,430,052 B1 | 8/2002 | Kordes et al. | 361/719 |
| 6,442,036 B2 | 8/2002 | Komatsu | 361/758 |
| 6,445,588 B1 | 9/2002 | Masterton et al. | 361/759 |
| 6,479,758 B1 | 11/2002 | Arima et al. | 174/260 |
| 6,492,202 B1 | 12/2002 | Lober et al. | 438/122 |
| 6,496,371 B2 | 12/2002 | Winkel et al. | 361/703 |
| 6,525,266 B2 | 2/2003 | Ferland et al. | 174/35 GC |
| 6,538,891 B1 | 3/2003 | He et al. | 361/704 |
| 6,545,868 B1 | 4/2003 | Kledzik et al. | 361/704 |
| 6,575,783 B1 | 6/2003 | Wu | 439/540.1 |
| 6,646,881 B1 * | 11/2003 | Lai et al. | 361/719 |
| 6,667,885 B2 | 12/2003 | Malone et al. | 361/700 |
| 6,734,371 B2 * | 5/2004 | Arrigotti et al. | 174/260 |
| 6,856,511 B1 | 2/2005 | Viernes et al. | 361/704 |
| 6,914,780 B1 | 7/2005 | Shanker et al. | 361/687 |
| 7,019,976 B1 | 3/2006 | Ahmad et al. | 361/704 |
| 7,102,890 B2 | 9/2006 | Lee et al. | 361/704 |
| 7,167,370 B2 | 1/2007 | Lee et al. | 361/719 |
| 2004/0066626 A1 | 4/2004 | Lee at al. | 361/704 |
| 2005/0254217 A1 * | 11/2005 | Lo et al. | 361/719 |

OTHER PUBLICATIONS

Assembled Heat Sinks Folded Assemblies, Sep. 20, 2002, http://www.aavidthermalloy.com/products/foldedfin/index.shtml, 2 pages.

* cited by examiner

TECHNIQUES FOR ATTACHING A HEATSINK TO A CIRCUIT BOARD USING ANCHORS WHICH INSTALL FROM AN UNDERSIDE OF THE CIRCUIT BOARD

BACKGROUND

There are a variety of conventional approaches to securing a heatsink to a circuit board. One conventional approach involves soldering U-shaped fasteners which are supported by a plastic block to a topside of a circuit board, and then engaging ends of a spring with the soldered U-shaped fasteners. When the U-shaped fasteners and the spring are properly installed, the heatsink sits on top of an integrated circuit (IC) package mounted to the topside of the circuit board, and the middle of the spring extends across a top of the heatsink to push the heatsink in the direction of the IC package and the circuit board. As a result, the spring, in combination with the soldered U-shaped fasteners, tightly hold the heatsink to the circuit board.

It should be understood that it is very common to mount circuit board components (e.g., Area Array Packages, gull-wing devices, discrete components, etc.) using Surface Mount Technology (SMT), and that the circuitry within some of these SMT components (e.g., high speed processors, Application Specific Integrated Circuits, Field Programmable Gate Arrays, etc.) require the use of heatsinks to maintain safe operating temperatures. The SMT mounting process typically involves printing solder paste over surface mount pads of the circuit board, picking and placing the components over the printed solder paste using automated equipment, and passing the circuit board through an oven to solder the components in place.

In contrast to the above-described SMT mounting process, soldering the earlier-mentioned U-shaped fasteners to a circuit board typically involves inserting end posts of the U-shaped fasteners into plated-through holes from the topside of the circuit board (i.e., from the same the same side of the circuit board onto which the component is mounted and over which the heatsink will attach), and applying solder into the plated-through holes (e.g., manually by a technician) to form solder-in-hole-type solder joints between the U-shaped fasteners and the plated-through holes of the circuit board. Accordingly, soldering of the U-shaped fasteners typically occurs after completing the SMT mounting process.

SUMMARY

Unfortunately, there are deficiencies to the above-described conventional approach to securing a heatsink to a circuit board using soldered U-shaped fasteners. For example, such circuit boards run the risk of the heatsinks detaching from the circuit boards if there are failures in the solder-in-hole-type solder joints between the U-shaped fasteners and the plated-through holes of the circuit board (e.g., during shock-and-vibration testing, during shipping, over time in the field, etc.). Furthermore, soldering the U-shaped fasteners into the plated-through holes of the circuit board typically requires an extra soldering step if the circuit board requires mounting SMT components using an SMT mounting process.

In contrast to the above-described conventional approach to securing a heatsink to a circuit board using soldered U-shaped fasteners, an improved heatsink attachment assembly utilizes an anchor which installs onto a circuit board from a side of the circuit board facing away from the heatsink, i.e., from the underside of the circuit board. The anchor is capable of forming a mechanical interference fit with the circuit board to provide a more reliable attachment point for a heatsink clip (or spring). That is, the anchor does not rely on solder-in-hole-type solder joints as do the above-described conventional U-shaped fasteners that require an extra soldering process, but that can nevertheless falter if the solder joints fail. Moreover, the anchor is easily removable if rework of the circuit board is required. Accordingly, the improved heatsink attachment assembly provides a simple, clean and dependable technique for attaching a heatsink to a circuit board.

The heatsink attachment assembly includes a first anchor, a second anchor and a heatsink clip. The first anchor is configured to insert into a first hole in a circuit board in an upward direction from an underside of the circuit board toward a topside of the circuit board. Similarly, the second anchor is configured to insert into a second hole in the circuit board in the upward direction. The heatsink clip has (i) a first end configured to fasten to the first anchor when the first anchor is inserted into the first hole in the circuit board, (ii) a second end configured to fasten to the second anchor when the second anchor is inserted into the second hole in the circuit board, and (iii) a middle section configured to provide force on the heatsink in a downward direction which is substantially opposite the upward direction.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved heatsink attachment assembly utilizes an anchor which installs onto a circuit board from a side of the circuit board facing away from the heatsink, i.e., from the underside of the circuit board. The anchor is capable of forming an interference fit with the circuit board to provide a reliable attachment point for a heatsink clip (or spring). That is, the anchor does not rely on solder joints as do conventional U-shaped fasteners that require an extra soldering process, but that can nevertheless falter if the solder joints fail. Moreover, the anchor is easily removable if rework of the circuit board is required. Accordingly, the improved heatsink attachment assembly provides a simple, clean and dependable technique for attaching a heatsink to a circuit board.

Figure 1:
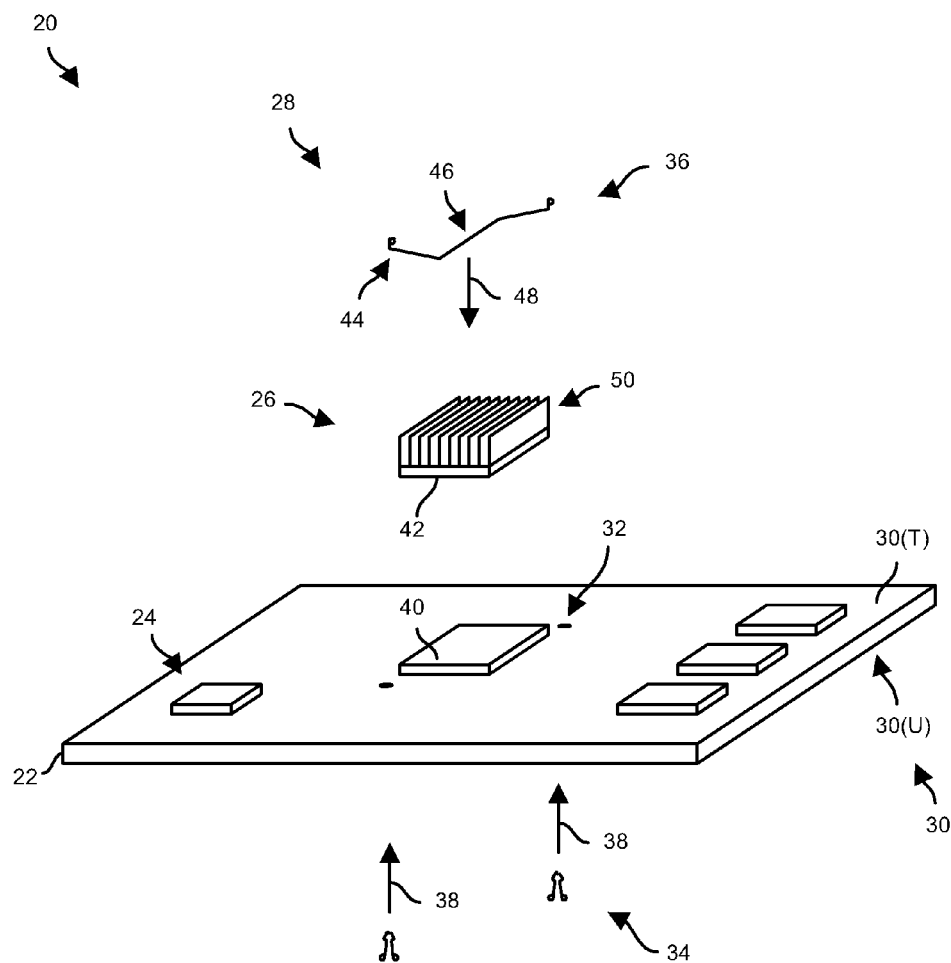
FIG. 1 is a perspective view of a circuit board module having a heatsink attachment assembly.

FIG. 1 shows a circuit board module 20 which includes a circuit board 22, a set of circuit board components 24, a heatsink 26 and an attachment assembly 28 (shown generally by the arrow 28). The circuit board 22 has a topside 30(T) and an underside 30(U) (collectively, sides 30) both of which are suitable for having circuit board components 24 mounted thereon, as well as a set of holes 32 which enable the attachment assembly 28 to attach the heatsink 26 (i) to the circuit board 22 and (ii) over a circuit board component 24 (e.g., an AAP packaged device).

The attachment assembly 28 includes anchors 34 and a heatsink clip (or spring) 36. To install the attachment assembly 28, a user inserts the anchors 34 into respective holes 32 in an upward direction 38, i.e., from the underside 30(U) of the circuit board 22 toward the topside 30(T) of the circuit board 22 (see the arrow 38 in FIG. 1). The user then places the heatsink 26 over the component 24 to be cooled, e.g., with thermal transfer material such as phase change material disposed between a top 40 of the component 24 and a base 42 of the heatsink 26. Finally, the user positions the heatsink clip 36 in place so that each end 44 of the heatsink clip 36 fastens to a respective anchor 34, and a middle section 46 of the heatsink clip 36 provides force 48 on the heatsink 26 in a downward direction (see the arrow 48 in FIG. 1) which is substantially opposite the upward direction 38.

It should be understood that the terms underside 30(U) and topside 30(T) are merely used to distinguish the side of the circuit board 22 having the component 24 to be cooled by the heatsink 26 (i.e., the topside 30(T)) from the side of the circuit board 22 that does not have the component 24 to be cooled by the heatsink 26 (i.e., the underside 30(U)). Similarly, the terms upward and downward are used to distinguish a direction of movement from the underside 30(U) to the topside 30(T) (i.e., upward), and a direction of movement from the topside 30(T) to the underside 30(U) (i.e., downward) which is substantially opposite the upward direction. These terms (e.g., topside 30(T), underside 30(U), upward, downward, etc.) are not necessarily intended to describe up or down relative to gravity.

At this point, the heatsink 26 is properly installed onto the component 24 and a heat dissipating portion 50 (e.g., fins) of the heatsink 26 function to dissipate heat from the component 24 into the surrounding environment (e.g., an air stream generated by a fan assembly). There are no solder joints needed to secure the anchors 34 to the circuit board 22. Rather, each anchor 34 enjoys a reliable interference fit with the circuit board 22. Further details of the attachment assembly 28 will now be provided with reference to FIG. 2.

Figure 2:
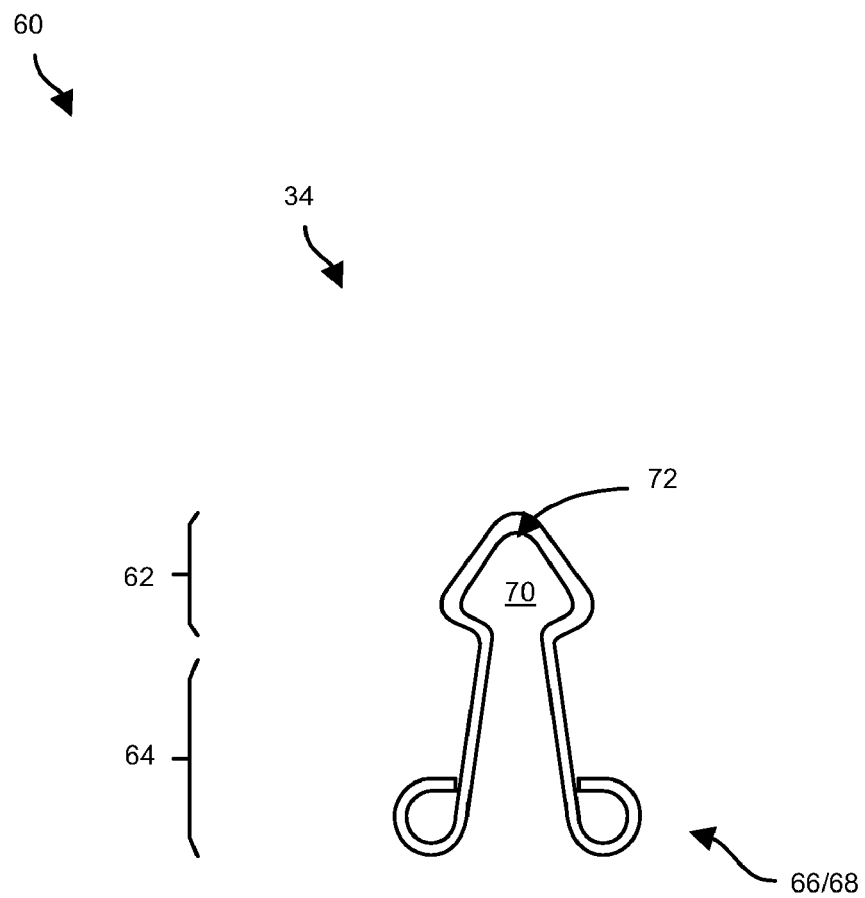
FIG. 2 is a side view of an anchor of the heatsink attachment assembly of the circuit board module of FIG. 1.

FIG. 2 shows a detailed side view 60 of an anchor 34. The anchor 34 includes a head portion 62 and a pair of legs 64 connected to the head portion 62. Each leg 64 defines a projection 66 which forms an end 68 of that leg 64.

As will be explained in further detail shortly, when the anchor 34 is properly installed onto the circuit board 22 (FIG. 1), the head portion 62 extends from the topside 30(T), and the pair of legs 64 extend through a hole 32 of the circuit board 22 so that the projections 66 extend from the underside 30(U) for a robust mechanical interference fit. The projections 66 are shaped both (i) to provide relatively large surfaces which make it easy for a user to squeeze the legs 64 together to overcome a repelling spring force in the anchor 34 during installation of the anchor 34 onto the circuit board 22, and (ii) to impede passage of the anchor 34 completely through the circuit board 22 from the underside 30(U) out through the topside 30(T) (e.g., to withstand 30 lbs. of pulling force from the heat sink clip 36).

In some arrangements, the anchor 34 is a unitary body and formed from a section of wire 70 which is shaped into the head portion 62 and the pair of legs 64 by bending the section of wire. In one arrangement, the head portion 62 defines a 60 degree angle at its apex, and the legs defining a 15 degree angle from the head portion 62. The ends 68 are bent into loops (or rings) to provide the projections 66. In this arrangement, attributes such as strength and resiliency of the anchor 34 are primarily controlled by the characteristics of the wire itself, e.g., its gauge/thickness, material composition, stiffness, etc. Furthermore, since the head portion 62 and the legs 64 are integral and derived from bending a continuous piece of wire, the anchor 34 is simple and inexpensive to manufacture in high volume as a single-piece retention mechanism. Moreover, it should be understood that there are various other curved features (i.e., bend radii, other angles and other shapes, etc.) which are suitable for use by the anchor 34 as well.

As shown in FIG. 2, the head portion 62 defines an opening 70 having a peak 72. During installation of the heatsink clip 36 (FIG. 1) onto the anchor 34, an end 44 of the heatsink clip 36 passes through the opening 70 and fastens to the head portion 62. Spring tension from the heatsink clip 36 (i.e., the end 44 of the heatsink clip 36 tries to move in the upward direction 48 and escape from the anchor 34) results in movement of the end 44 toward the peak 72 thus enabling the head portion 62 to capture and align the end 44 of the heatsink clip 36 in a well-controlled, self-centering manner. Further details will now be provided with reference to FIG. 3.

Figure 3:
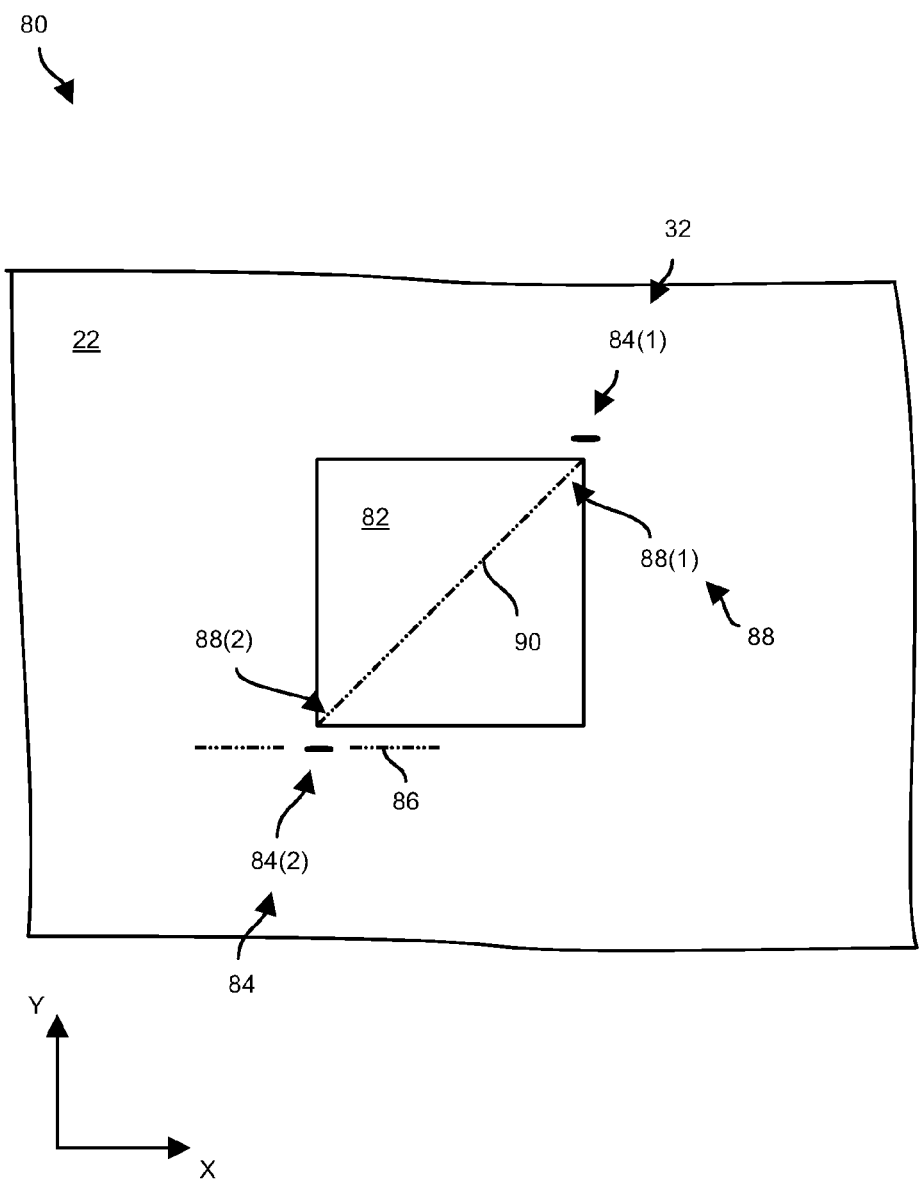
FIG. 3 is a top view of a component mounting location of a circuit board of the circuit board module of FIG. 1.

FIG. 3 is a top view 80 of the circuit board 22. As shown, the circuit board 22 includes a rectangular footprint 82 (e.g., an array of SMT pads) onto which mounts the component 24 to be cooled (also see FIG. 1). As further shown in FIG. 3, the circuit board 22 defines two elongated slots 84(1), 84(2) (collectively, elongated slots 84) as the holes 32. Each elongated slot 84 (e.g., an oval hole through the circuit board 22 having dimensions of 0.180×0.030 inches) has an elongated axis 86 which is coplanar with the circuit board 22 (i.e., within the X-Y plane). The elongated axes 86 are substantially parallel to each other and to sides of the rectangular footprint 82 (e.g., along the X-axis). Accordingly, a circuit board designer is capable of conveniently laying traces in a parallel manner adjacent the elongated slots 84, e.g., any adjacent traces which lead to the footprint 82 are capable of running in a well-organized parallel manner to the slots 84 to provide minimal intrusion on routing.

As further shown in FIG. 3, the elongated slots 84 are disposed adjacent opposite corners 88 of the rectangular footprint 82. That is, the elongated slots 84 reside along a diagonal 90 of the rectangular footprint 82 thus enabling the heatsink clip 36 (i) to fasten across the entire to component 24 to be cooled and (ii) to comprehensively apply force 48 across the central region of the component 24 (FIG. 1). Further details will now be provided with reference to FIG. 4.

Figure 4:
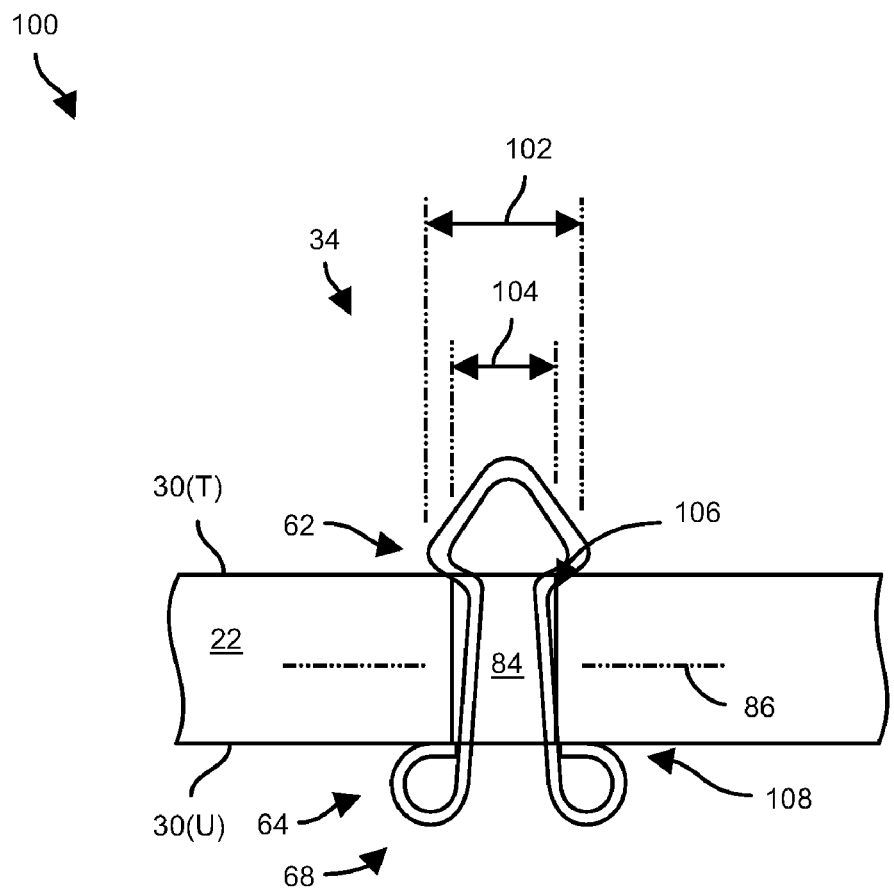
FIG. 4 is a cross-sectional side view of the circuit board when an anchor is installed to provide an interference fit.

FIG. 4 is a cross-sectional side view 100 of a portion of the circuit board 22 when an anchor 34 is installed within an elongated slot 84 to obtain an interference fit (also see the holes 32 in FIG. 1). As shown in FIG. 4, the head portion 62 of the anchor 34 has a head length 102 which is slightly longer than a slot length 104 of the elongated slot 84 (e.g., 0.180 inches) along the elongated axis 86 (e.g., the X-axis) of the slot 84 to provide interference at the topside 30(T) of the circuit board 22. Additionally, the pair of legs 64 flare outwardly from the head portion 62 against the circuit board 22. That is, the legs 64 taper from a topside space 106 which is narrower that the slot length 104 to an underside space 108 which is longer than the slot length 104 to provide interference at the underside 30(U) of the circuit board 22. Accordingly, the anchor 34 is well-fastened to the circuit board 22, and no soldering process is required.

To install the anchor 34 onto the circuit board 22 as shown in FIG. 4, a user compresses the ends 68 of the legs 64 together. Such compression results in temporarily shortening of the head length 102 of the head portion 62 thus enabling the head portion 62 to more easily enter the elongated slot 84. The user then inserts the anchor 34 into the elongated slot 84 in the positive Z-direction and continues to move the anchor 34 through the elongated slot 84 until the head portion 62 passes completely through and extends from the topside 30(T) circuit board 22. The user releases the legs 64 allowing (i) the legs 64 to expand and exert themselves against the circuit board 22 and (ii) the ends 68 to butt against the underside 30(U) of the circuit board 22. Since the user has released the ends 68, the head length 102 increases beyond the slot length 104 thus preventing the anchor 34 from escaping in the negative Z-direction. Furthermore, the ends 68 block the anchor 34 from passing fully through the elongated slot 84 in the positive Z-direction thus reliably retaining the anchor 34 within the elongated slot 84 in a mechanical manner.

Preferably, the anchor 34 remains slightly compressed within the elongated slot 84 so that slight tension remains due to spring force exerted by the anchor 34 outwardly toward the side walls of the elongated slot 84. Interference from the various surfaces of the anchor 34 in combination with friction between the tapering legs 64 and the circuit board 22 holds the anchor 34 in place and prevents the anchor 34 from sliding. As a result, the anchor 34 remains tightly held within the elongated slot 84 of the circuit board 22 to allow the heatsink clip 36 (FIG. 1) to subsequently attach to the protruding head portion 62.

As described above, an improved heatsink attachment assembly 28 utilizes an anchor which installs onto a circuit board 22 from a side 30(U) of the circuit board 22 facing away from the heatsink 26, i.e., from the underside 30(U) of the circuit board 22. The anchor 34 is capable of forming a mechanical interference fit with the circuit board 22 to provide a reliable attachment point for a heatsink clip (or spring) 36. That is, the anchor 34 does not rely on solder joints as do conventional U-shaped fasteners that require an extra soldering process, but that can nevertheless falter if the solder joints fail, i.e., the anchor 34 is not susceptible to solder joint deficiencies (e.g., cold solder joint failures, fatigue due to elevated temperatures and expansion forces, etc.). Moreover, the anchor 34 is easily installable without an extra soldering process, and is easily removable if rework of the circuit board 22 is required. Accordingly, the improved heatsink attachment assembly 28 provides a simple, clean and dependable technique for attaching a heatsink 26 to a circuit board 22.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the circuit board 22 is capable of providing grounding pads adjacent the elongated slots 84 to enable the looped ends 68 of the anchors 34 to connect to ground. Such capability enables grounding of the anchors 34, the heatsink clip 36 and the heatsink 26 for safety purposes.

Additionally, it should be understood that it is not necessary that the head portions 62 of the anchors 34 provide a head length 102 which is longer than a slot length 104 of the elongated slots 84. Rather, in some arrangements, the head length 102 is not longer thus making it easier for a user to remove the anchors 34 from the elongated slots 84 if desired (e.g., during rework). For such arrangements, the anchors 34 are still well-suited to preventing a failure (i.e., heatsink detachment from the circuit board 22) since the ends 68 of the anchors 34 prevent the anchors 34 from pulling out of the circuit board 22.

Furthermore, it should be understood that the anchors 34 were described above as providing an interference fit by way of example only. In other arrangements, the anchors 34 are configured to retain within the circuit board 22 in a different manner (e.g., lock, engage or fit into place with the circuit board 22 in a different non-soldering manner).

Additionally, it should be understood that the anchors 34 were described above as being formed from a section of wire by way of example only. There are other methods for making the anchors 34 which are suitable for use as well such as stamping and/or bending sheet metal, molding the anchors 34, etc.

What is claimed is:

1. A circuit board module, comprising:
   a circuit board having a topside and an underside;
   a circuit board component mounted to the circuit board;
   a heatsink; and
   an attachment assembly for attaching the heatsink to the circuit board over the circuit board component, the assembly including:
   a first anchor inserted into a first hole in the circuit board in an upward direction from the underside of the circuit board toward the topside of the circuit board,
   a second anchor inserted into a second hole in the circuit board in the upward direction, and
   a heatsink clip having (i) a first end fastened to the first anchor, (ii) a second end fastened to the second anchor, and (iii) a middle section that provides force on the heatsink in a downward direction which is substantially opposite the upward direction;
   wherein each anchor is substantially formed from a section of wire that is bent to provide (i) a head portion which extends from the topside of the circuit board and (ii) legs which extend from the underside of the circuit board.

2. The circuit board module of claim 1 wherein the first hole defines a first elongated axis which is coplanar with a plane of the circuit board, wherein the second hole defines a second elongated axis which is coplanar with the plane of the circuit board, and wherein the first elongated axis and the second elongated axis are substantially parallel to each other.

3. The circuit board module of claim 2 wherein the circuit board includes a rectangular footprint onto which the circuit board component is mounted, and wherein the first elongated axis and the second elongated axis are substantially parallel to the rectangular footprint.

4. The circuit board module of claim 3 wherein the first hole is disposed adjacent a first corner of the rectangular footprint, wherein the second hole is disposed adjacent a second corner of the rectangular footprint, the first corner being opposite the second corner along a diagonal through the rectangular footprint.

5. The circuit board module of claim 1 wherein the legs of each anchor are formed by wire loops which make contact with the underside of the circuit board.

6. The circuit board module of claim 1 wherein the first anchor and the second anchor are physically separated from each other to enable individual and independent insertion of the first and second anchors through the circuit board at different times.

7. A circuit board module, comprising:
a circuit board having a topside and an underside;
a circuit board component mounted to the circuit board;
a heatsink: and
an attachment assembly for attaching the heatsink to the circuit board over the circuit board component, the assembly including:
a first anchor inserted into a first hole in the circuit board in an upward direction from the underside of the circuit board toward the topside of the circuit board,
a second anchor inserted into a second hole in the circuit board in the upward direction, and
a heatsink clip having (i) a first end fastened to the and (iii) a middle section that provides force on the heatsink in a downward direction which is substantially opposite the upward direction;
wherein each anchor of the attachment assembly includes:
a head portion; and
a pair of legs which connect to that head portion, each leg defining a projection that extends from that leg, wherein the head portion extends from the topside of the circuit board, and wherein the projection defined by each leg extends from the underside of the circuit board.

8. The circuit board module of claim 7 wherein the circuit board defines elongated slots as the first and second holes, wherein each slot defines a slot length along a long axis, wherein the head portion of each anchor defines a head length which is longer than the slot length, and wherein the pair of legs of each anchor tapers outwardly from a topside space which is narrower than the slot length to an underside space which is longer than the slot length to provide an interference fit between each anchor and the circuit board.

9. The circuit board module of claim 8 wherein each anchor is configured to install into an elongated slot of the elongated slots in response to (i) squeezing of the legs of that anchor together, (ii) passing the head portion of that anchor completely through the elongated slot, and (iii) releasing the legs of that anchor to enable the legs to uncompress.

10. The circuit board module of claim 8 wherein, for each anchor, the head portion defines an opening having a peak to capture and align one of the first and second ends of the heatsink clip.

11. The circuit board module of claim 7 wherein the first anchor and the second anchor are physically separated from each other to enable individual and independent insertion of the first and second anchors through the circuit board at different times.

12. An assembly for attaching a heatsink to a circuit board, the assembly comprising:
a first anchor configured to insert into a first hole in the circuit board in an upward direction from an underside of the circuit board toward a topside of the circuit board;
a second anchor configured to insert into a second hole in the circuit board in the upward direction; and
a heatsink clip having (i) a first end configured to fasten to the first anchor when the first anchor is inserted into the first hole in the circuit board, (ii) a second end configured to fasten to the second anchor when the second anchor is inserted into the second hole in the circuit board, and (iii) a middle section configured to provide force on the heatsink in a downward direction which is substantially opposite the upward direction;
wherein each anchor includes:
a head portion; and
a pair of legs which connect to that head portion, each leg defining a projection that extends from that leg, and wherein the head portion is configured to extend from the topside of the circuit board and the projection defined by each leg is configured to extend from the underside of the circuit board when the anchor is inserted into one of the first and second holes in the circuit board.

13. The assembly of claim 12 wherein the circuit board defines elongated slots as the first and second holes, wherein each slot defines a slot length along a long axis, wherein the head portion of each anchor defines a head length which is longer than the slot length, and wherein the pair of legs of each anchor tapers outwardly from a topside space which is narrower than the slot length to an underside space which is longer than the slot length to provide an interference fit between each anchor and the circuit board.

14. The assembly of claim 13 wherein each anchor is configured to install into an elongated slot of the elongated slots in response to (i) squeezing of the legs of that anchor together, (ii) passing the head portion of that anchor completely through the elongated slot, and (iii) releasing the legs of that anchor to enable the legs to uncompress.

15. The assembly of claim 13 wherein, for each anchor, the head portion defines an opening having a peak to capture and align one of the first and second ends of the heatsink clip.

16. The assembly of claim 12 wherein the first anchor and the second anchor are physically separated from each other to enable individual and independent insertion of the first and second anchors through the circuit board at different times.

17. An assembly for attaching a heatsink to a circuit board, the assembly comprising:
a first anchor configured to insert into a first hole in the circuit board in an upward direction from an underside of the circuit board toward a topside of the circuit board;
a second anchor configured to insert into a second hole in the circuit board in the upward direction; and
a heatsink clip having (i) a first end configured to fasten to the first anchor when the first anchor is inserted into the first hole in the circuit board, (ii) a second end configured to fasten to the second anchor when the second anchor is inserted into the second hole in the circuit board, and (iii) a middle section configured to provide force on the heatsink in a downward direction which is substantially opposite the upward direction;
wherein each anchor is substantially formed from a section of wire that is bent to provide (i) a head portion which is configured to extend from the topside of the circuit board and (ii) legs which are configured to extend from the underside of the circuit board.

18. The assembly of claim 17 wherein the legs of each anchor are formed by wire loops which are configured to make contact with the underside of the circuit board.

19. The assembly of claim 17 wherein the first anchor and the second anchor are physically separated from each other to enable individual and independent insertion of the first and second anchors through the circuit board at different times.

20. An assembly for attaching a heatsink to a circuit board, the assembly comprising:

a first anchor configured to insert into a first hole in the circuit board in an upward direction from an underside of the circuit board toward a topside of the circuit board;

a second anchor configured to insert into a second hole in the circuit board in the upward direction; and means for fastening to the first and second anchors when the first and second anchors are inserted into the first and second holes in the circuit board, and for providing force on the heatsink in a downward direction which is substantially opposite the upward direction;

wherein each anchor includes:

a head portion; and a pair of legs which connect to that head portion, each leg defining a projection that extends from that leg, and wherein the head portion is configured to extend from the topside of the circuit board and the projection defined by each leg is configured to extend from the underside of the circuit board when the anchor is inserted into one of the first and second holes in the circuit board.

21. An assembly for attaching a heatsink to a circuit board, the assembly comprising:

a first anchor configured to insert into a first hole in the circuit board in an upward direction from an underside of the circuit board toward a topside of the circuit board;

a second anchor configured to insert into a second hole in the circuit board in the upward direction; and means for fastening to the first and second anchors when the first and second anchors are inserted into the first and second holes in the circuit board, and for providing force on the heatsink in a downward direction which is substantially opposite the upward direction;

wherein each anchor is substantially formed from a section of wire that is bent to provide (i) a head portion which is configured to extend from the topside of the circuit board and (ii) legs which are configured to extend from the underside of the circuit board.

* * * * *